(12) United States Patent
Kim et al.

(10) Patent No.: US 8,368,488 B2
(45) Date of Patent: Feb. 5, 2013

(54) ELECTROMAGNETIC BANDGAP STRUCTURE AND PRINTED CIRCUIT BOARD

(75) Inventors: Han Kim, Yongin-si (KR); Hyung-Sik Choi, Hwaseong-si (KR); Sang-Hoon Kim, Gunpo-si (KR); Joon-Sung Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1177 days.

(21) Appl. No.: 12/155,941

(22) Filed: Jun. 11, 2008

(65) Prior Publication Data

US 2008/0314634 A1 Dec. 25, 2008

(30) Foreign Application Priority Data

Jun. 22, 2007 (KR) .................. 10-2007-0061834

(51) Int. Cl.
*H01P 1/203* (2006.01)
(52) U.S. Cl. .................. 333/204; 333/246; 333/247
(58) Field of Classification Search .................. 333/165, 333/175, 176, 185, 202–205, 219, 235, 238, 333/246, 247; 430/311
See application file for complete search history.

(56) References Cited

U.S. PATENT DOCUMENTS

2006/0038639 A1* 2/2006 McKinzie, III ............... 333/219
2009/0071709 A1* 3/2009 Han et al. ...................... 174/360

FOREIGN PATENT DOCUMENTS

JP 2000-151213 5/2000

OTHER PUBLICATIONS

Ahmadi et al, "An Efficient CMOS On-Chip Antenna Structure for System in Package Transceiver Applications", Jan. 9-11, 2007, IEEE, pp. 487-490.*
Japanese Office Action issued Sep. 14, 2010 in corresponding Japanese Patent Application 2008-155427.

* cited by examiner

*Primary Examiner* — Benny Lee
*Assistant Examiner* — Gerald Stevens

(57) ABSTRACT

An electromagnetic bandgap structure and a printed circuit board that can solve a mixed signal problem between an analog circuit and a digital circuit are disclosed. In accordance with an embodiment of the present invention, an electromagnetic bandgap structure is stacked with a first metal layer, a first dielectric layer, a metal plate, a second dielectric layer and a second metal layer, and an odd number of vias can be serially connected through a metal line between the first metal layer and the metal plate. This electromagnetic bandgap structure can have a small size and a low bandgap frequency.

30 Claims, 22 Drawing Sheets

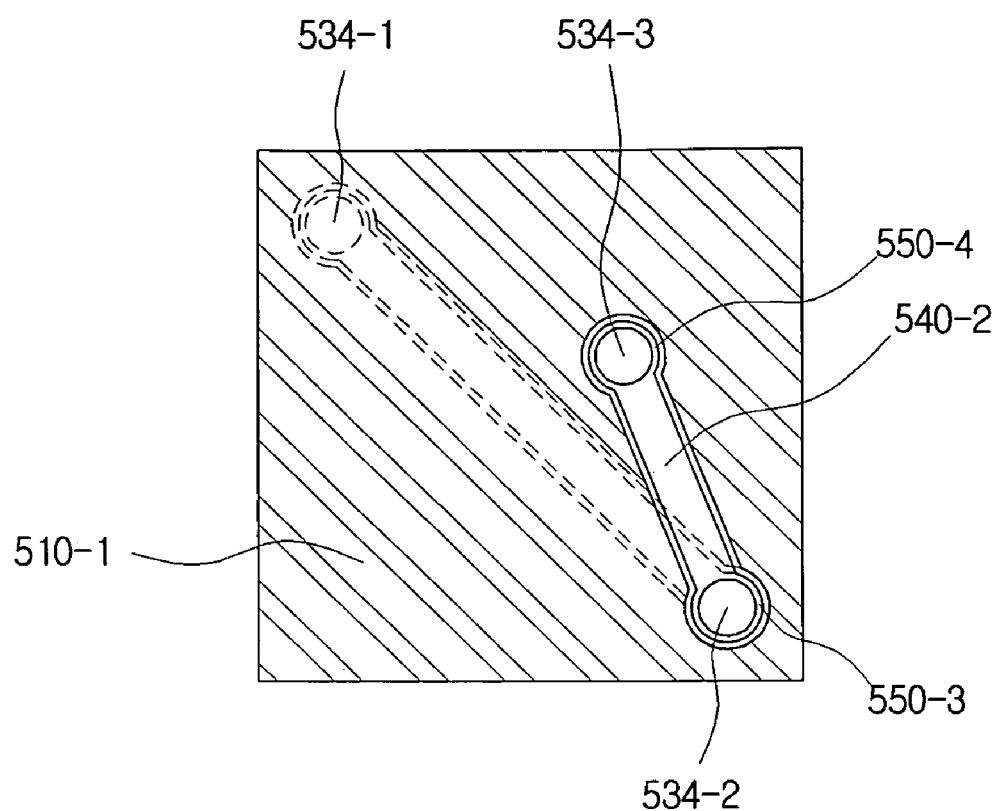

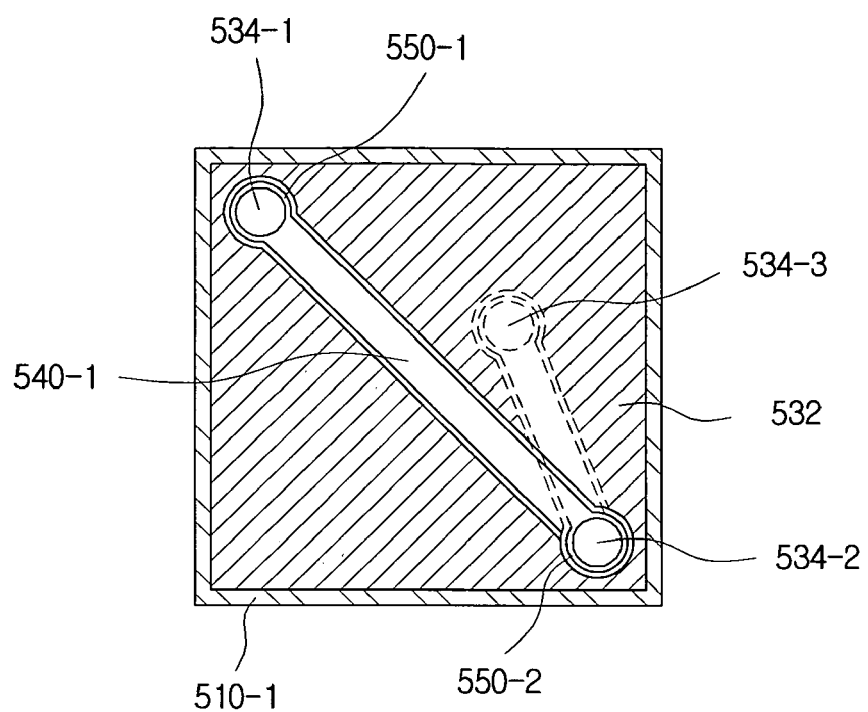

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 2007-0061834, filed on Jun. 22, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to a printed circuit board that can solve a mixed signal problem between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards, such as 2 and 6-layered printed circuit boards, can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140

If it is assumed that the metal layer represented by reference numeral 110-2 is a ground layer and the metal layer represented by reference numeral 110-3 is a power layer, a current passes through a via 160 connected between the ground layer 110-2 and the power layer 110-3, and the printed circuit board 100 performs a predetermined operation or function.

Here, an operation frequency of the digital circuit 130 and an electromagnetic (EM) wave 150 by harmonics components are transferred to the RF circuit 140, to thereby generate a problem of mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate in high frequencies.

Accordingly, it is necessary to intercept or decrease the noise of the high frequencies between the RF circuit 140 and the digital circuit 130.

FIG. 2 is a sectional view showing an electromagnetic bandgap structure that solves a problem of mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a, a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is a power layer, the second layer 210-2 is a ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function of preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example of an electronic apparatus employing the board realized with the digital circuit and the RF circuit together. In the case of the mobile communication terminal, solving the problem of mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem of mixed signals.

Since a bandgap frequency of a noise shielding becomes higher as the mushroom type structure becomes smaller, the mobile communication terminal is not effective between 0.8 and 2.0 GHz of operation frequency band of the RF circuit.

SUMMARY OF THE INVENTION

Accordingly, the present invention provides an electromagnetic bandgap structure and a printed circuit board that have a small size and a low bandgap frequency.

The present invention also provides an electromagnetic bandgap structure and a printed circuit board that can solve a problem of mixed signals in an electronic apparatus (e.g. a mobile communication terminal) employing the board having the digital circuit and the RF circuit, realized therein together.

The present invention also provides an electromagnetic bandgap structure and a printed circuit board that make noise of a certain frequency not transmit.

The present invention also provides an electromagnetic bandgap structure and a printed circuit board that can have a sufficient inductance in a small space by having a plurality of vias in the electromagnetic bandgap structure and isolating an interval of each via.

An aspect of present invention features an electromagnetic bandgap structure that prevents a signal of certain frequency from being transmitted.

The electromagnetic bandgap structure in accordance with an embodiment of the present invention can be stacked with a first metal layer, a first dielectric layer, a metal plate, a second dielectric layer and a second metal layer. The electromagnetic bandgap structure can include an odd number of vias serially connected through a metal line between the first metal layer and the metal plate.

The odd number of vias can be located on one plane, or all of the odd number of vias except at leas one can be located on one plane.

The metal line can be a shape of straight line that connects each of the vias, or the metal line can be a shape of straight line or curve that is turned one or more times at angle and connects each of the vias.

There can be a plurality of mushroom type structures, each of which includes the metal plate and the odd number of vias, between the first metal layer and the second metal layer. The metal plates of the plurality of mushroom type structures can be placed on a same planar surface.

Another aspect of present invention features a printed circuit board that includes an analog circuit and a digital circuit and thus can prevent a digital circuit from transmitting a signal of certain frequency band of an analog circuit.

The printed circuit board in accordance with an embodiment of the present invention can be disposed with an electromagnetic bandgap structure, in which a first metal layer, a first dielectric layer, a metal plate, a second dielectric layer and a second metal layer are stacked, between the analog circuit and the digital circuit, and an odd number of vias can be serially connected through a metal line between the first metal layer and the metal plate.

Here, the first metal layer can be one of a ground layer and a power layer, and the second metal layer can be the other.

Also, the analog circuit can be an RF circuit including an antenna receiving a wireless signal from an outside.

Also, the odd number of vias can be located on one plane, and all of the odd number of vias except at least one can be located on one plane.

Also, the metal line can be a shape of straight line or straight line or curve that is turned at angle to connect between each of the vias.

Moreover, there can be a plurality of mushroom type structures, each of which includes the metal plate and the odd number of vias, between the first metal layer and the second metal layer. Here, the metal plates of the plurality of mushroom type structures can be placed on a same planar surface.

BRIEF DESCRIPTION OF THE DRAWINGS

These and other features, aspects and advantages of the present invention will become better understood with regard to the following description, appended claims and accompanying drawings where:

Figure 9:
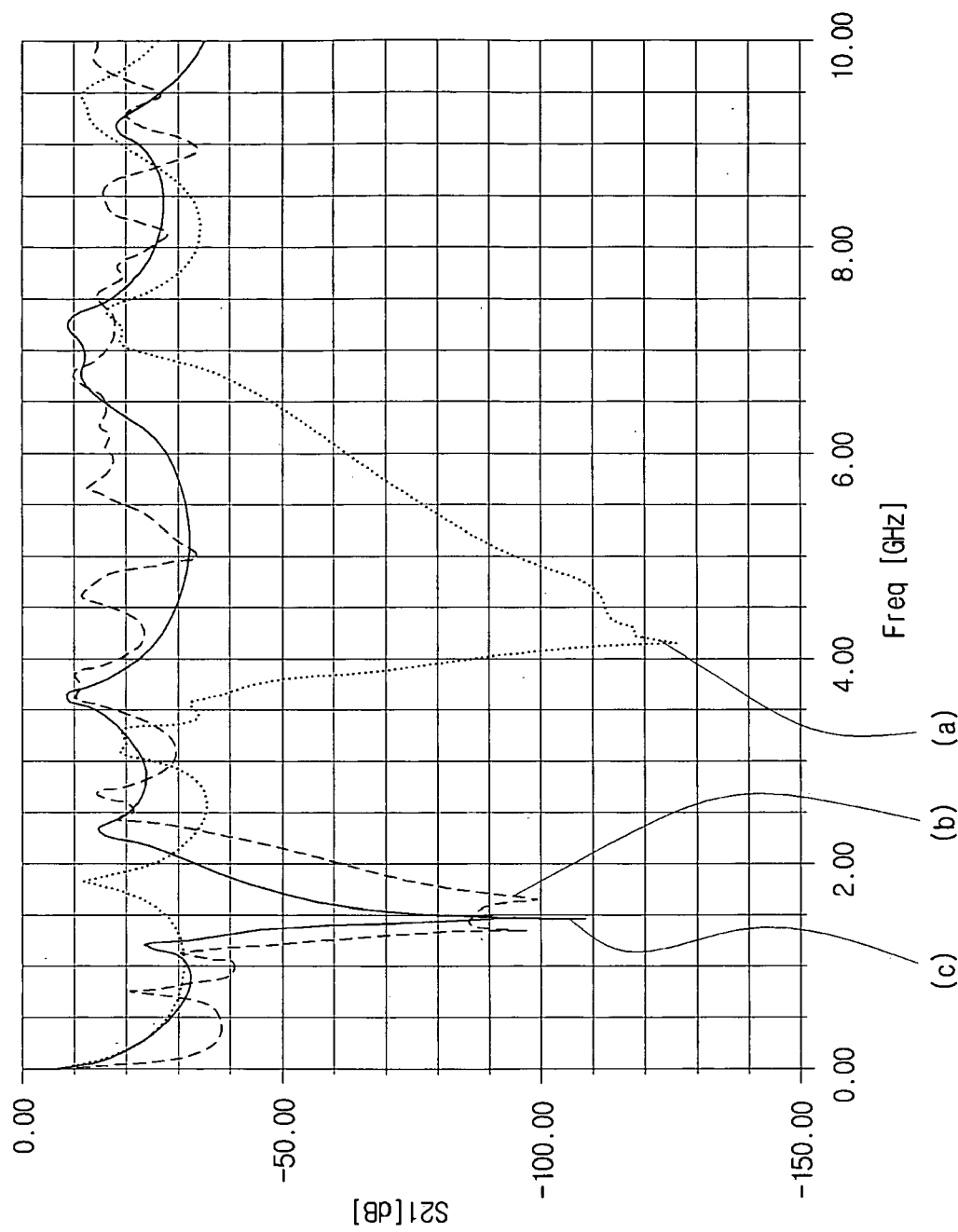
Figure 10:
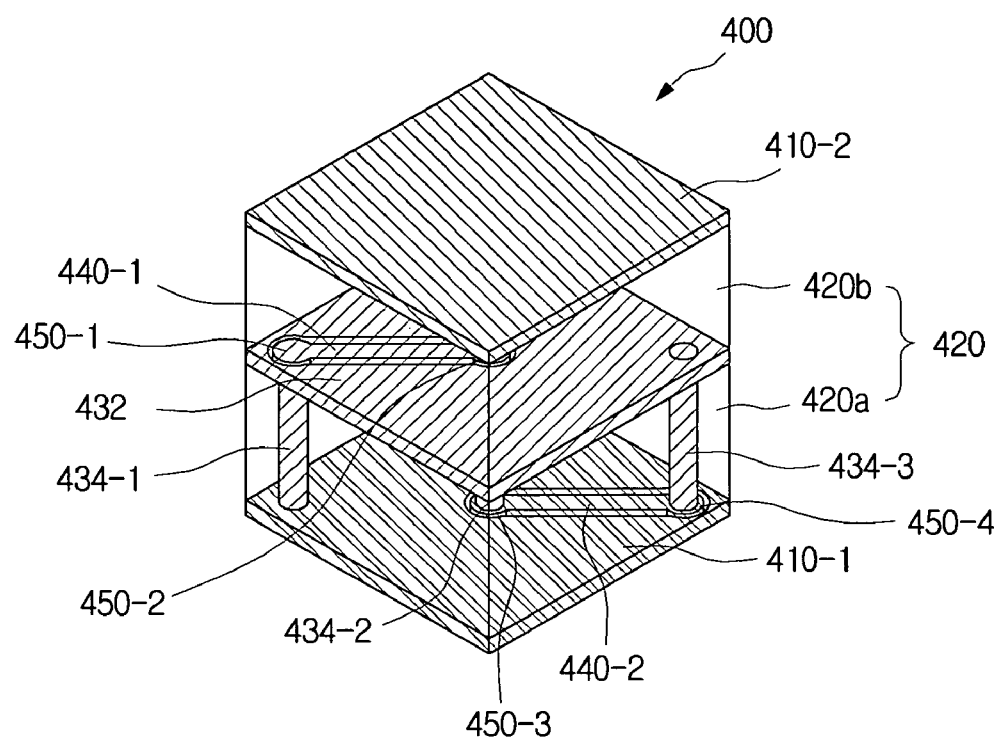
Figure 11:
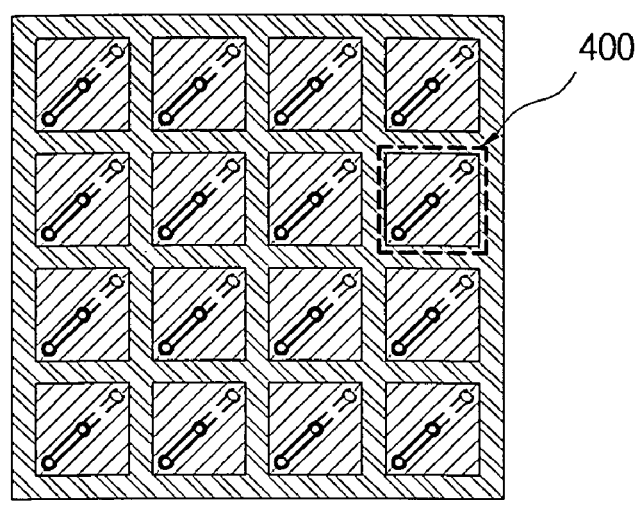
Figure 12A:
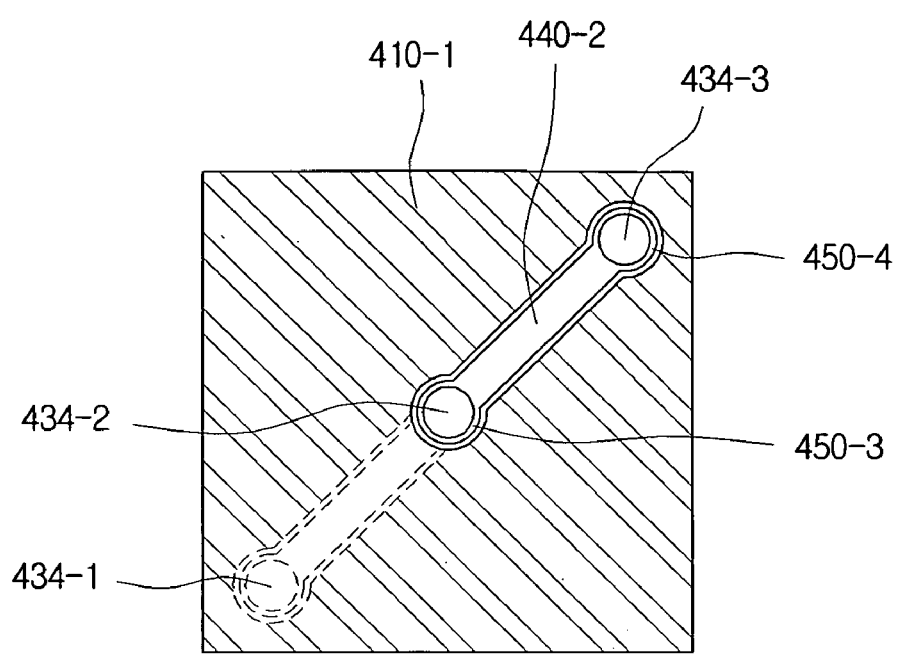
Figure 12B:
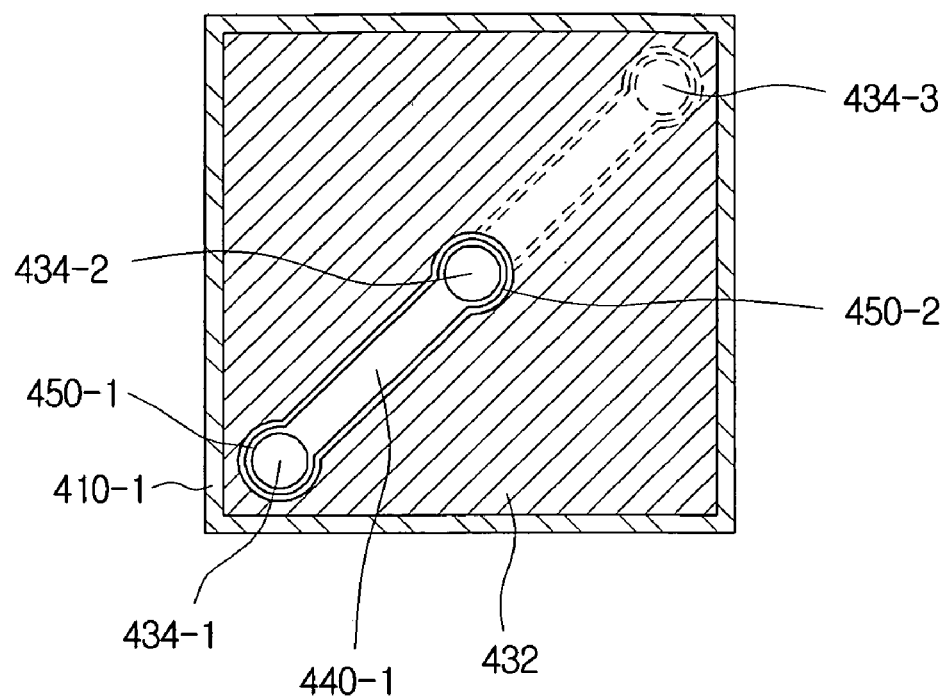
Figure 13:
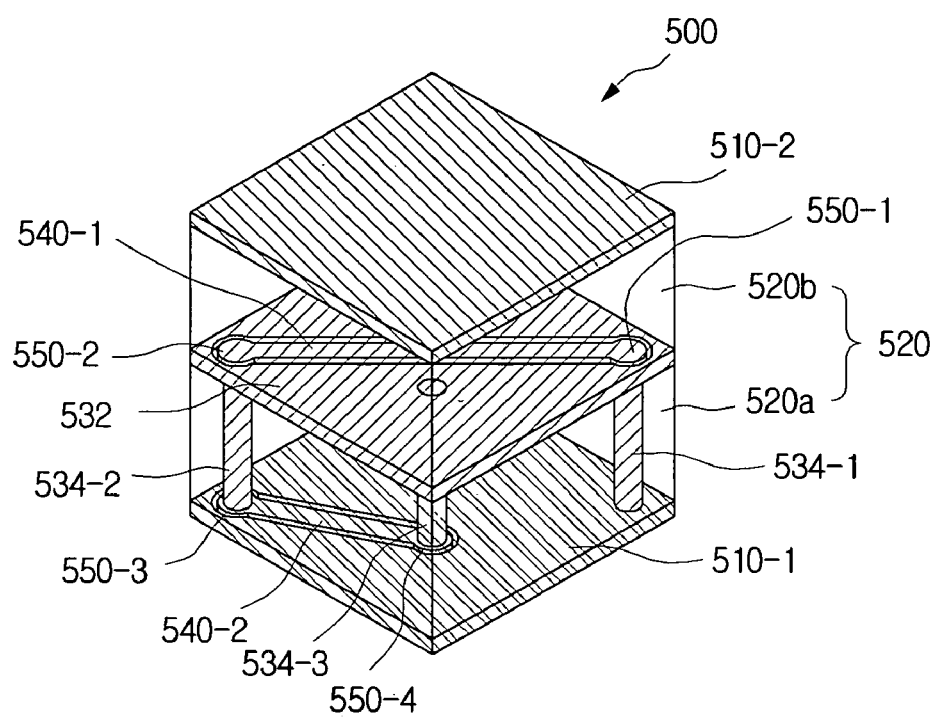
Figure 14:
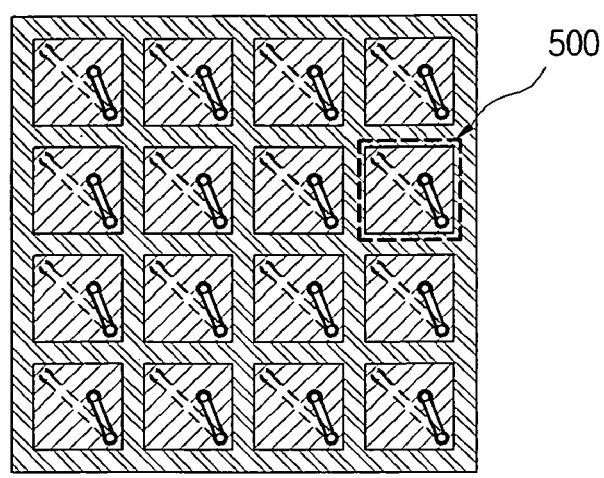
Figure 16:
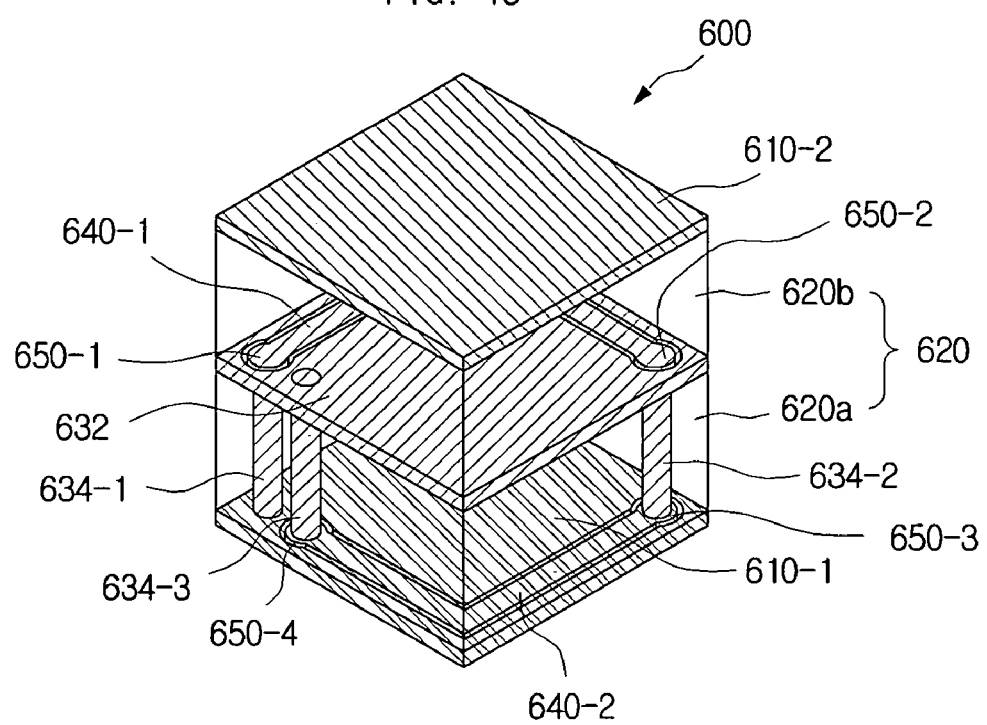
Figure 17:
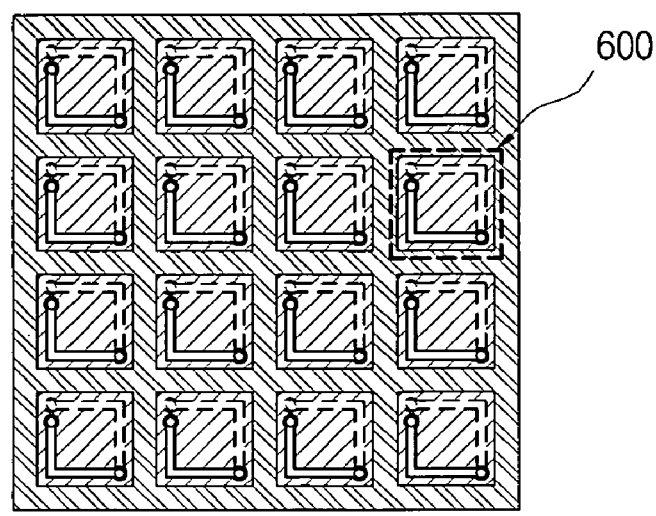
Figure 18A:
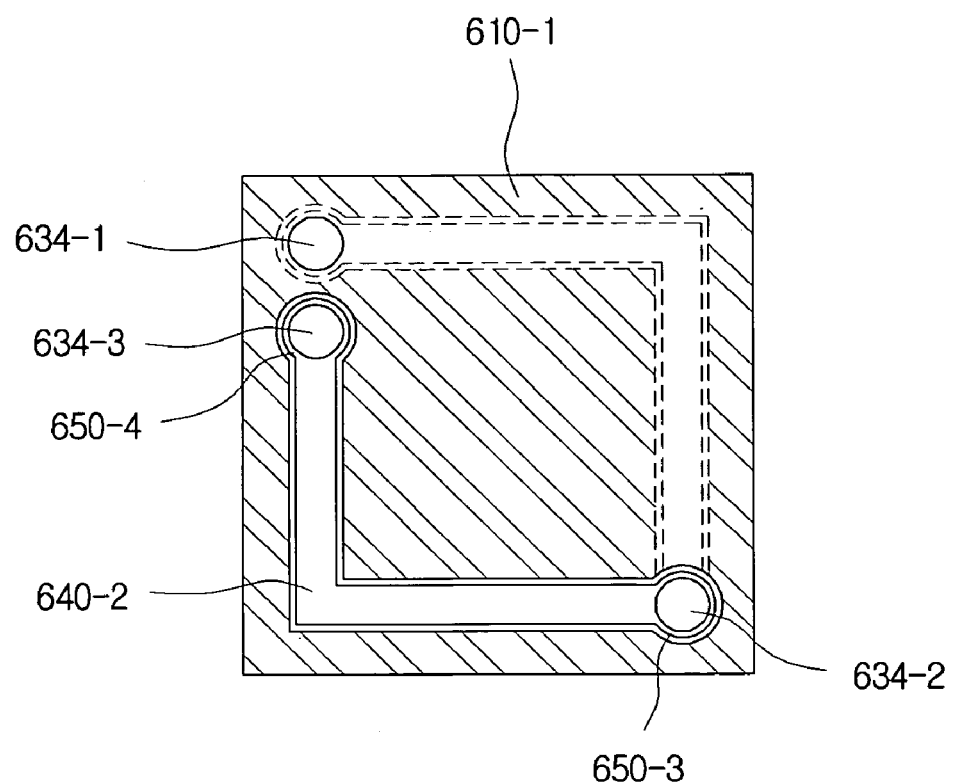
Figure 18B:
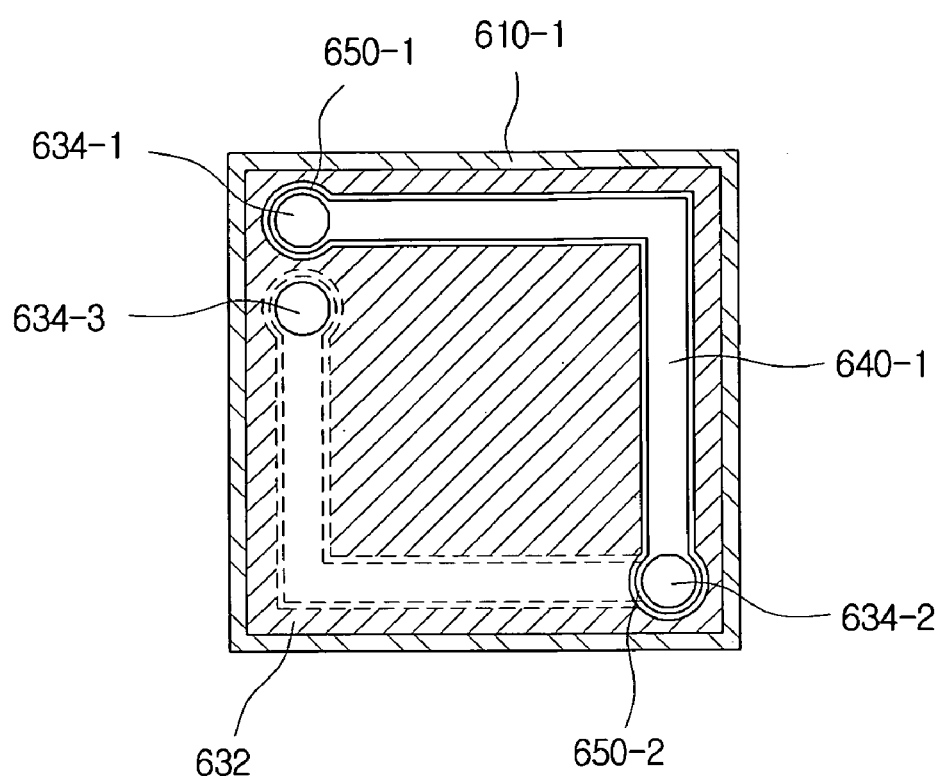
Figure 19:
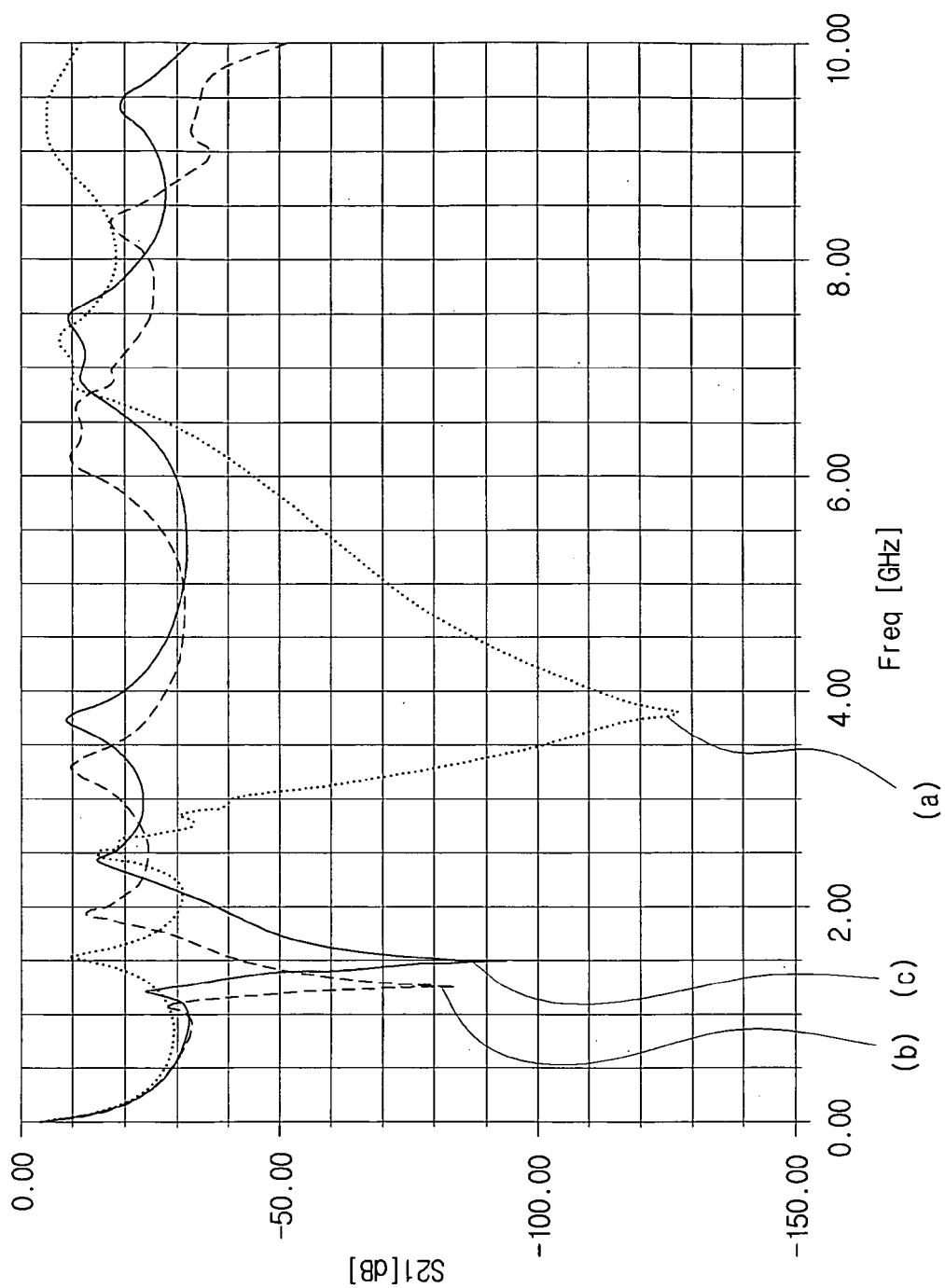

The FIG. 9 is a diagram showing the simulation result of using the electromagnetic bandgap structure of the present invention and the electromagnetic bandgap structure of the related art;

FIG. 10 is a perspective view showing an electromagnetic bandgap structure in accordance with another embodiment of the present invention which solves a mixed signal problem between an analog circuit and a digital circuit;

FIG. 11 is a plan view showing an arrangement structure of the electromagnetic bandgap structure;

FIG. 12a is a plan view that is viewed in the first metal layer of the electromagnetic bandgap structure illustrated in the FIG. 10;

FIG. 12b is a plan view that is viewed in the metal plate of the electromagnetic bandgap structure illustrated in the FIG. 10;

FIG. 13 is a perspective view showing an electromagnetic bandgap structure in accordance with another embodiment of the present invention which solves a mixed signal problem between an analog circuit and a digital circuit;

FIG. 14 is a plan view showing an arrangement structure of the electromagnetic bandgap structure illustrated in FIG. 13;

FIG. 15a is a plan view that is viewed in the first metal layer of the electromagnetic bandgap structure illustrated in the FIG. 13;

FIG. 15b is a plan view that is viewed in the metal plate of the electromagnetic bandgap structure illustrated in the FIG. 13;

FIG. 16 is a perspective view showing an electromagnetic bandgap structure in accordance with another embodiment of the present invention which solves a mixed signal problem between an analog circuit and a digital circuit;

FIG. 17 is a plan view showing an arrangement structure of the electromagnetic bandgap structure illustrated in FIG. 16;

FIG. 18a is a plan view that is viewed in the first metal layer of the electromagnetic bandgap structure illustrated in the FIG. 16;

FIG. 18b is a plan view that is viewed in the metal plate of the electromagnetic bandgap structure illustrated in the FIG. 16; and FIG. 19 is a diagram showing the simulation result of using the electromagnetic bandgap structure of the related art, the electromagnetic bandgap structure of one embodiment of the present invention and the electromagnetic bandgap structure of another embodiment of the present invention.

DESCRIPTION OF THE EMBODIMENTS

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 6:
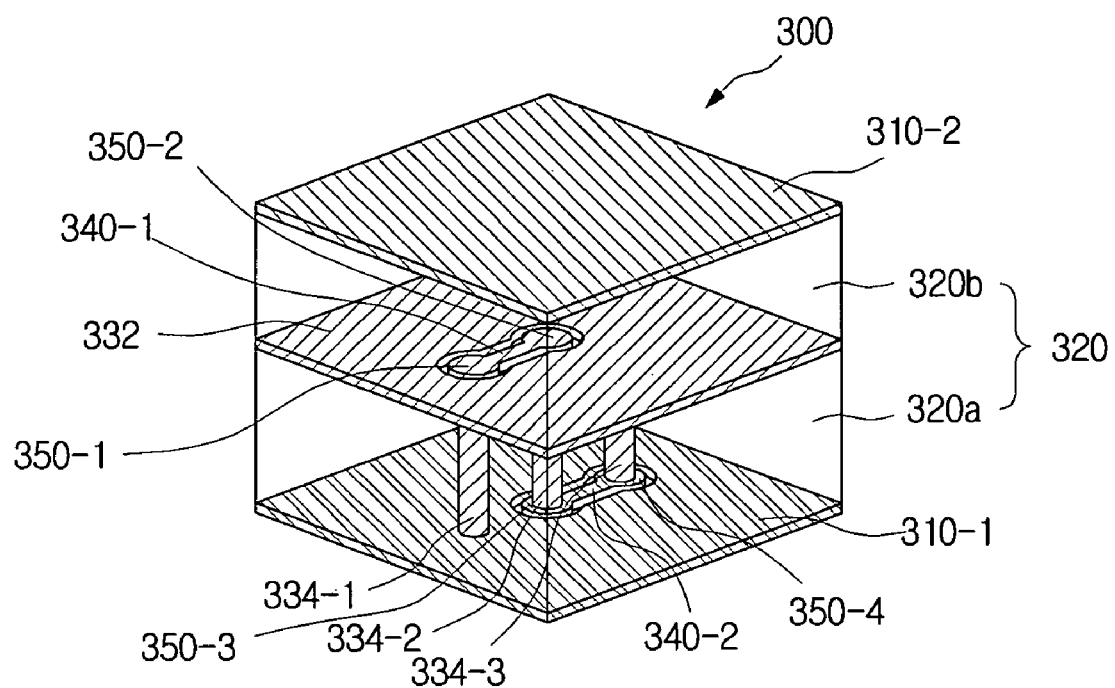
FIG. 6 is a perspective view showing an electromagnetic bandgap structure which solves a mixed signal problem between an analog circuit and a digital circuit.
Figure 7:
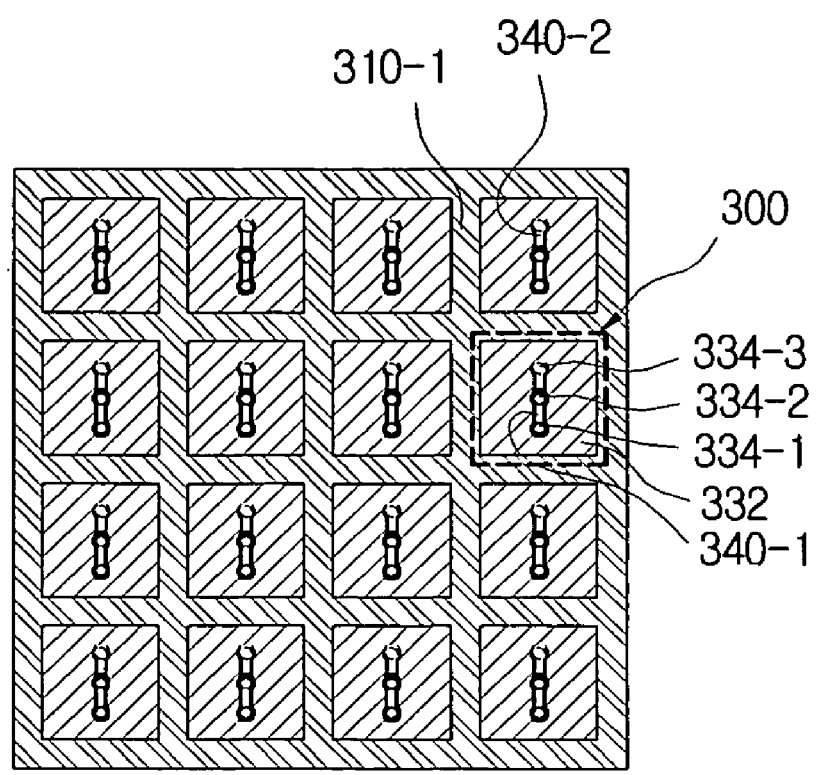
FIG. 7 is a plan view showing arrangement configuration of the electromagnetic bandgap structure shown in FIG. 6.
Figure 8:
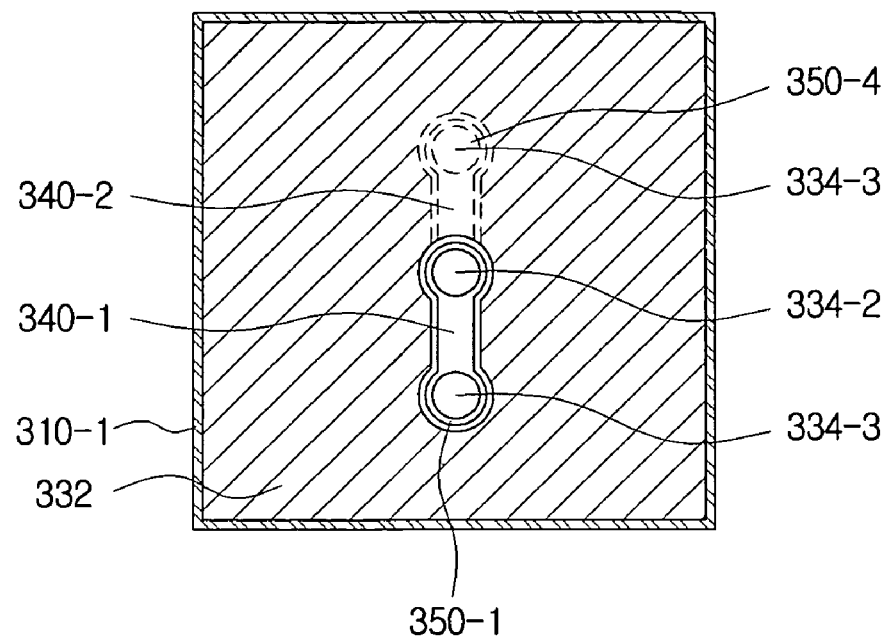
FIG. 8 is a plan of the electromagnetic bandgap structure shown in FIG. 6.

FIG. 6 is a perspective view showing an electromagnetic bandgap structure which solves a mixed signal problem between an analog circuit and a digital circuit, and FIG. 7 is a plan view showing arrangement configuration of the electromagnetic bandgap structure shown in FIG. 6. FIG. 8 is a plan of the electromagnetic bandgap structure shown in FIG. 6

The electromagnetic bandgap structure 300 includes a first metal layer 310-1, a second metal layer 310-2, a first dielectric layer 320a, a second dielectric layer 320b, a meal plate 332 and three vias 334-1, 334-2, 334-3 in accordance with an embodiment.

One end of a first via 334-1 is connected to the first metal layer 310-1 and the other end is connected to a first via land 350-1 that is formed on a same planar surface, which is on a same layer with the metal plate 332. One end of a second via 334-2 is connected to the second via land 350-2 that is formed on a same planar surface, which is on a same layer with the metal plate 332, and the other end is connected to a third via land 350-3 that is formed on a same planar surface, which is on a same layer, with the first metal layer 310-1. One end of a third via 334-3 is connected to the metal plate 332, and the other end is connected to a fourth via land 350-4 that is formed on a same planar surface, which is on a same layer with the first metal layer 310-1.

The first via land 350-1 and the second via land 350-2 are placed on a same planar surface with the metal plate 332 and connected by the first metal line 340-1, and the first via land 350-1, the second via land 350-2 and the first metal line 340-1 are housed in a hole that is formed on the metal plate 332. The third via land 350-3 and the fourth via land 350-4 are placed on a same planar surface with the first metal layer 310-1 and connected by the second metal line 340-2, and the third via land 350-3, the fourth via land 350-4 and the second metal line 340-2 are housed in a hole that is formed on the first metal layer 310-1.

A hole that can house the first via land 350-1, the second via land 350-2 and the first metal line 340-1 is formed on the metal plate 332, and an inside wall of the hole is separated from and thus is not connected with an edge side wall of the first via land 350-1, the second via land 350-2 and the first metal line 340-1.

A hole that can house the third via land 350-3, the fourth via land 350-4 and the second metal line 340-2 is formed on the first metal layer 310-1, and an inside wall of the hole is separated from and thus is not connected with an edge side wall of the third via land 350-3, the fourth via land 350-4 and the second metal line 340-2.

Between the first metal layer 310-1 and the metal plate 332, the first dielectric layer 320a can be formed. Between the metal plate 332 and the second metal layer 310-2, the second dielectric layer 320b can be formed. The dielectric layer 320 can be distinguished into the first dielectric layer 320a and the second dielectric layer 320b according to their formation time.

The first metal layer 310-1, the second metal layer 310-2, the metal plate 332, the first to the fourth via lands 350-1 to 350-4 and the first and second metal lines 340-1 and 340-2 are made of metal material (for example, Cu) through which signal can be transmitted by supplying power.

Here, the first dielectric layer 220a and the second dielectric layer 220b can consist of the same dielectric material but alternatively, each of the dielectric layers 220a and 220b can consist of materials having different dielectric constants.

If the first metal layer 210-1 is a ground layer, the second metal layer 210-2 can be a power layer. If the first metal layer 210-1 is a power layer, the second metal layer 210-2 can be a ground layer. In other words, the first metal layer 210-1 and the second metal layer 210-2 can be a ground layer and a power layer, which are placed close to each other, and the dielectric layer 220 can be placed between the ground layer and the power layer.

The metal plate 332 is illustrated as a square but can be in a variety of shapes, such as polygon, circle, ellipse and so on.

An embodiment of the present invention has a serial electrical connection in the order of the first metal layer 310-1→the first via 334-1→the first via land 350-1→the first metal line 340-1→the second via land 350-2→the second via 334-2→the third via land 350-3→the second metal line 340-2→the fourth via land 350-4→the third via 334-3→the metal plate 332.

In this case, the capacitance (CE) between the metal plate 332 and the second metal layer 310-2 becomes negligibly minute, and the inductance (LE) serially connected between the first metal layer 310-1 and the metal plate 332 can be sufficient even in a small space. Therefore, it is possible to lower the bandgap frequency while the size of the electromagnetic bandgap structure 300 is made small.

The method of forming the electromagnetic bandgap structure is as follows.

After, stacking the first metal layer 310-1, a patterning process that houses the third via land 350-3, the fourth via land 350-4 and the second metal line 340-2 in a hole is performed. The patterning process uses the well-known method of masking, exposing, etching, developing and so on that are used generally when a circuit pattern is formed, and the pertinent description will be omitted.

The first dielectric layer 320a is stacked on the first metal layer 310-1, the third via land 350-3, the fourth via land 350-4 and the second metal line 340-2. Then, the first via 334-1, which connects the first metal layer 310-1 and the first via land 350-1 to be formed on the first dielectiric layer, the second via 334-2, which connects the second via land 350-2 and the third via land 350-3, and the third via 334-3, which connects the metal plate 332 and the fourth via land 350-4, are formed.

The forming of the via uses a drilling process and a plating process to have a plated layer formed in the inner wall of the via for electrical connection after the first dielectric layer 320a is passed through. Through the plating process, the center part of the inside of via becomes empty and the plated layer is formed on the inside wall of the via, or all of the inside of the via is filled After the via is formed, the metal plate 332 is stacked on the first dielectric layer 320a, and the first via land 350-1, the second via land 350-2 and the first metal line 340-1 are patterned. Also, the second dielectric layer 320b and the second metal layer 310-2 can be successively stacked in, and the electromagnetic bandgap structure 300 can be formed.

One or more mushroom structures, including the metal plate 332, the first to third vias 334-1 to 334-3, can be formed between the first metal layer 310-1 and the second metal layer 310-2. A hole can be formed in the first metal layer 310-1 according to the location where the mushroom structure is formed, and the inside of the hole can house the third via land 350-3, which connect the second via 334-2 and the third via 334-3, the fourth via land 350-4 and the second metal line 340-2, which connects the third via land 350-3 and the fourth via land 350-4.

The metal plate 332 of the mushroom structure can be placed on a same planar surface or on different planar surfaces. Although, FIG. 6 illustrates that the first to third vias 334-1 to 334-3 of the mushroom structure is facing the first metal layer 310-1, the first to third vias 334-1 to 334-3 of the mushroom structure can face the second metal layer 310-2.

Also, there can be many mushroom structures, and all of the vias of the mushroom structure can be facing the first metal layer 310-1 or the second metal layer 310-2, or some of the vias of the mushroom structure can be facing the first metal layer 310-1 and the rest of vias of the mushroom structure can be facing the second metal layer 310-2.

FIG. 7 illustrates that the mushroom type structures can be spaced from each other at predetermined intervals and be repeatedly arranged on the first metal layer 310-1. The repeated formation of the mushroom type structures can make it possible to block a signal having a frequency band corresponding to an operation frequency band of an analog circuit (e.g. an RF circuit) among an electromagnetic wave proceeding from a digital circuit to the analog circuit.

In the mushroom type structure, because many vias, via lands and metal lines are serially connected between the first metal layer 310-1 and the metal plate 332, it is possible that sufficient inductance is acquired in small space, thereby lowering, not raising, the bandgap frequency despite the small size of the mushroom structure. Bandgap frequency means frequency suppressed to not transmit an EM wave that is emitted from one side to the other side of the electromagnetic bandgap structure 300. In an embodiment of the present invention, the operating frequency range of an RF circuit in a mobile communication terminal, in the range of 0.8~2.0 GHz, is the bandgap frequency range.

The FIG. 9 illustrates the simulation results of using the electromagnetic bandgap structure 300 in accordance with an embodiment of the present invention and the electromagnetic bandgap structure 200 of the related art, Referring to FIG. 9, the electromagnetic bandgap structure 200 of the related art (i.e. size of the metal plate 232) is in the size of 16 mm$^2$ (4×4) (refer to (a)) and 100 mm$^2$ (10×10) (refer to (b)).

When the size of the structure is 16 mm$^2$ (4×4) (refer to (a)), the frequency of a noise level that is below −50 dB is 3.7~6.5 GHz and the frequency of the noise level that is the lowest is 4.5 GHz.

When the size of the structure is 100 mm$^2$ (10×10) (refer to (b)), the frequency of the noise level that is below −50 dB is 1.2~2.2 GHz and the frequency of the noise level that is the lowest is 1.5 GHz.

In accordance with the electromagnetic bandgap structure 200 of the related art, the bandgap frequency is placed within 0.8~2.0 GHz, which is the operating frequency range of an RF circuit in a mobile communication terminal, for blocking the noise, and thus the size of the structure must be 100 mm$^2$ (10×10) (refer to (b)).

However, in accordance with the electromagnetic bandgap structure of the present invention, in case that the size of the electromagnetic bandgap structure (i.e. size of the metal plate 350) is 16 mm$^2$ (4×4) (refer to (a)), the frequency of the noise level that is below −50 dB is 1.3~1.7 GHz, and the frequency of the noise level that is the lowest is 1.5 GHz.

This is represented in Table 1 shown below.

TABLE 1

|  | Bandgap frequency | Size of the structure | Noise level |
| --- | --- | --- | --- |
| The structure of the related art | 4.5 GHz | 16 mm$^2$ (4 × 4) | −50 dB |
|  | 1.5 GHz | 100 mm$^2$ (10 × 10) | −50 dB |
| The structure of the present invention | 1.5 GHz | 16 mm$^2$ (4 × 4) | −50 dB |

That is, in accordance with an embodiment of the present invention, the size of the electromagnetic bandgap structure 300 can be reduced by over ⅙ (100 mm$^2$→16 mm$^2$) while having a bandgap frequency that is the same as the electromagnetic bandgap structure 200 of the related art.

Also, even if the size of the electromagnetic bandgap structure of the present invention is the same as the electromagnetic bandgap structure of the related art, the bandgap frequency is lower by over ⅓ (4.5 GHz→1.5 GHz).

In this embodiment of the present invention, it is preferable for having a high inductance that the interval between each via is wider, that is, the length of the metal line is made longer. This is because the direction of current of the first via 334-1 is the same as that of the third via 334-3, and is opposite from that of the second via 334-2, and thus the value of the inductance becomes smaller by mutual inductance when the interval between each via is close.

Therefore, in the electromagnetic bandgap structure 300 in accordance with an embodiment of the present invention, the center axis of the second via 334-2 is made to be the same as the center of the metal plate 332, and the first via 334-1 is placed symmetrically with the third via 334-3 about the center axis of the metal plate 332. Also, in the plan view, the first metal line 340-1 and the second metal line 340-2 are located on a straight line and are parallel with one surface of the metal plate 332.

Other embodiments for making the interval between each via wider will be described with reference to FIG. 10.

FIG. 10 is a perspective view showing an electromagnetic bandgap structure in accordance with another embodiment of the present invention that solves a mixed signal problem between an analog circuit and a digital circuit, and FIG. 11 is a plan view showing an arrangement structure of the electromagnetic bandgap structure. FIG. 12a is a plan view viewed in the first metal layer of the electromagnetic bandgap structure illustrated in FIG. 10, and FIG. 12b is a plan view viewed in the metal plate of the electromagnetic bandgap structure illustrated in the FIG. 10.

An electromagnetic bandgap structure 400 in accordance with another embodiment can include a first metal layer 410-1, a second metal layer 410-2, a first dielectric layer 420a, a second dielectric layer 420b, a metal plate 432 and three vias 434-1, 434-2 and 434-3, like the electromagnetic bandgap structure 300 illustrated in FIG. 6.

Compared with the electromagnetic bandgap structure 300 illustrated in FIG. 6, the electromagnetic bandgap structure 400 illustrated in FIG. 10 has different locations of the first to third vias 434-1 to 434-3, the first to fourth via lands 450-1 to 450-4, and the first to second metal lines 440-1 and 440-2. As the same element as the electromagnetic bandgap structure 300 illustrated in FIG. 6 has been described above, only different elements will be described hereunder.

As described above, sufficient inductance must be attained in a small space in order for the electromagnetic bandgap structure to be smaller and for the bandgap frequency to be lower. For this, a sufficient interval between each via must be secured.

Thus, the first via 434-1, the second via 434-2 and the third via 434-3 of the electromagnetic bandgap structure 400 illustrated in FIG. 10 are separated as much as possible. The center axis of the second via 434-2 is the same as the center of the metal plate 432, and the first via 434-1 is placed at a symmetrical location from the third via 334-3 about the center axis of the metal plate 332 and at a corner of the metal plate 432, which is the farthest location from the center of the metal plate 432.

Each of the via lands 450-1 to 450-4 is formed according to the location of each via, and the first metal line 440-1 and the second metal line 440-2 are also formed according to each via land. In this case, it is preferable for attaining sufficient inductance that the interval between the first via 434-3 and the second via 434-2, and the interval between the second via 434-2 and the third via 434-3 that opposite current flows, respectively, are guaranteed sufficiently.

FIG. 13 is a perspective view showing an electromagnetic bandgap structure in accordance with another embodiment of the present invention which solves a mixed signal problem between an analog circuit and a digital circuit, and FIG. 14 is a plan view showing an arrangement structure of the electromagnetic bandgap structure illustrated in FIG. 13. FIG. 15a is a plan view viewed in the first metal layer of the electromagnetic bandgap structure illustrated in FIG. 13, and FIG. 15b is a plan view viewed in the metal plate of the electromagnetic bandgap structure illustrated in FIG. 13.

An electromagnetic bandgap structure 500 in accordance with another embodiment can include a first metal layer 510-1, a second metal layer 510-2, a first dielectric layer 520a, a second dielectric layer 520b, a metal plate 532 and three vias 534-1, 534-2 and 534-3, like the electromagnetic bandgap structure 300 illustrated in FIG. 6.

Compared with the electromagnetic bandgap structure 300 illustrated in FIG. 6, the electromagnetic bandgap structure 500 illustrated in FIG. 13 has different locations of the first to third vias 534-1 to 534-3, the first to fourth via lands 550-1 to 550-4, and the first to second metal lines 540-1 and 540-2. Since the same part as the electromagnetic bandgap structure 300 has been illustrated in FIG. 6, only the difference-part will be described hereunder.

As described above, sufficient inductance must be attained in order for the electromagnetic bandgap structure to be smaller and for the bandgap frequency to be lower. For this, a sufficient interval between each via must be secured.

Thus, the first via 534-1, the second via 534-2 and the third via 534-3 of the electromagnetic bandgap structure 500 illustrated in FIG. 13 are separated as much as possible. The first via 534-1 and the second via 534-2 are placed close to opposite corners, which can separate the two vias as much as possible. That is, the first via 534-1 and the second via 543-2 are located on either ends of a diagonal line of the metal plate 532. Also, the third via 534-3 is located on the other diagonal line that is the same or similar distance from the first via 534-1 and the second via 534-2.

Each of the via lands 550-1 to 550-4 is formed according to the location of each via, and the first metal line 540-1 and the second metal line 540-2 are also formed according to each via land. Here, the first metal line 540-1 is the diagonal line of the metal plate 532. In this case, it is preferable for attaining sufficient inductance that the interval between the first via 534-1 and the second via 534-2, and the interval between the second via 534-2 and the third via 534-3 that opposite current flows, respectively, are guaranteed sufficiently.

FIG. 16 is a perspective view showing an electromagnetic bandgap structure in accordance with another embodiment of the present invention which solves a mixed signal problem between an analog circuit and a digital circuit, and FIG. 17 is a plan view showing an arrangement structure of the electromagnetic bandgap structure illustrated in FIG. 16. FIG. 18a is a plan view viewed in the first metal layer of the electromagnetic bandgap structure illustrated in FIG. 16, and FIG. 18b is a plan view viewed in the metal plate of the electromagnetic bandgap structure illustrated in FIG. 16.

An electromagnetic bandgap structure 600 in accordance with another embodiment can include a first metal layer 610-1, a second metal layer 610-2, a first dielectric layer 620a, a second dielectric layer 620b, a metal plate 632 and three vias 634-1, 634-2 and 634-3, like the electromagnetic bandgap structure 300 illustrated in FIG. 6.

Compared with the electromagnetic bandgap structure 300 illustrated in FIG. 6, the electromagnetic bandgap structure 600 illustrated in FIG. 16 has different locations of the first to third vias 634-1 to 634-3, the first to fourth via lands 650-1 to 650-4 and the first to second metal lines 640-1 and 640-2. As the same part as the electromagnetic bandgap structure 300 illustrated in FIG. 6 has been described above, only the different part will be described hereunder.

As described above, sufficient inductance must be attained in a small space in order for the electromagnetic bandgap structure to be smaller and for the bandgap frequency to be lower. For this, a sufficient interval between each via must be secured.

Thus, the first via 634-1, the second via 634-2 and the third via 634-3 of the electromagnetic bandgap structure 600 illustrated in FIG. 16 are separated as much as possible. The first-via 634-1 and the second via 634-2 are placed close to the corners, which can be separated as much as possible, to face each other. That is, the first via 634-1 and the second via 6543-2 are located on either end point of diagonal line of the metal plate 632. Also, the third via 634-3 is placed near the first via 634-1 that can be separated as much as possible from the second via 634-2.

Each of the via lands 650-1 to 650-4 is formed according to the location of each via In the present embodiment, the metal line is not straight but has an "L" shape to be close to an edge of the metal plate 632. The first metal line 640-1 connects the first via land 650-1 with the second via land 650-2, and the second metal line 640-2 connects the third via land 650-3 and the fourth via land 650-4. Also, when viewed from the top, the first metal line 640-1 is separated from the second metal line 640-2 as much as possible. For example, when the metal plate 632 and the first metal layer 610-1 are squares, as illustrated in FIG. 16 to FIG. 18b, if the first metal line 640-1 is curved to one corner at which the first via 634-1 and the second via 643-2 are not located, the second metal line 640-2 is curved to the other corner at which the first via 634-1 and the second via 643-2 are not located.

In this case, it is easily possible to attain sufficient inductance even in a small space because the interval between the first via 634-1 and the second via 634-2, and the interval between the second via 634-2 and the third via 634-3, between which an opposite current flows, respectively, are maximized.

FIG. 19 illustrates the simulation result of using the electromagnetic bandgap structure 200 of the related art, the electromagnetic bandgap structure 300 in accordance with an embodiment of the present invention and the electromagnetic bandgap structure 400 in accordance with another embodiment of the present invention Here, FIG. 19 is a case that the electromagnetic bandgap structure of the related art and the electromagnetic bandgap structure of the present invention have the same size (16 mm$^2$ (6×6)) and the same arrangement.

Referring to the graph (refer to (a)) of bandgap frequency according to the electromagnetic bandgap structure 200 of the related art, the frequency of which noise level is below −50 dB is 3.1~6.2 GHz, and the frequency of which noise level is the lowest is 3.8 GHz.

However, referring to a graph (refer to (b)) of bandgap frequency according to the electromagnetic bandgap structure of the present invention, the frequency of which noise level is below −50 dB is 1.3~1.7 GHz, and the frequency of which noise level is the lowest is 1.5 GHz. Moreover, referring to a graph (refer to (c)) of bandgap frequency according to the electromagnetic bandgap structure of another embodiment of the present invention, the frequency of which noise level is below −50 dB is 1.1~1.3 GHz, and the frequency of which noise level is the lowest is 1.2 GHz.

This bandgap frequency can be designed to have a desired bandgap frequency band by adjusting a variety of conditions, such as the size of the electromagnetic bandgap structure, the thickness of each part, the permittivity, the shape of arrangement. That is, it is apparent that, despite the same design condition, FIG. 19 is only an example to show that, if the structure that gurantees a sufficient inductance in a small space like the electromagnetic bandgap structures 300 and 400 of the present invention is applied, the blocking rate to certain frequency band, specially within the bandgap frequency band, could be improved.

A printed circuit board in accordance with an embodiment of the present invention includes an analog circuit and a digital circuit. The analog circuit can be an RF circuit, like an antenna, which receives an RF signal from the outside.

Figure 1:
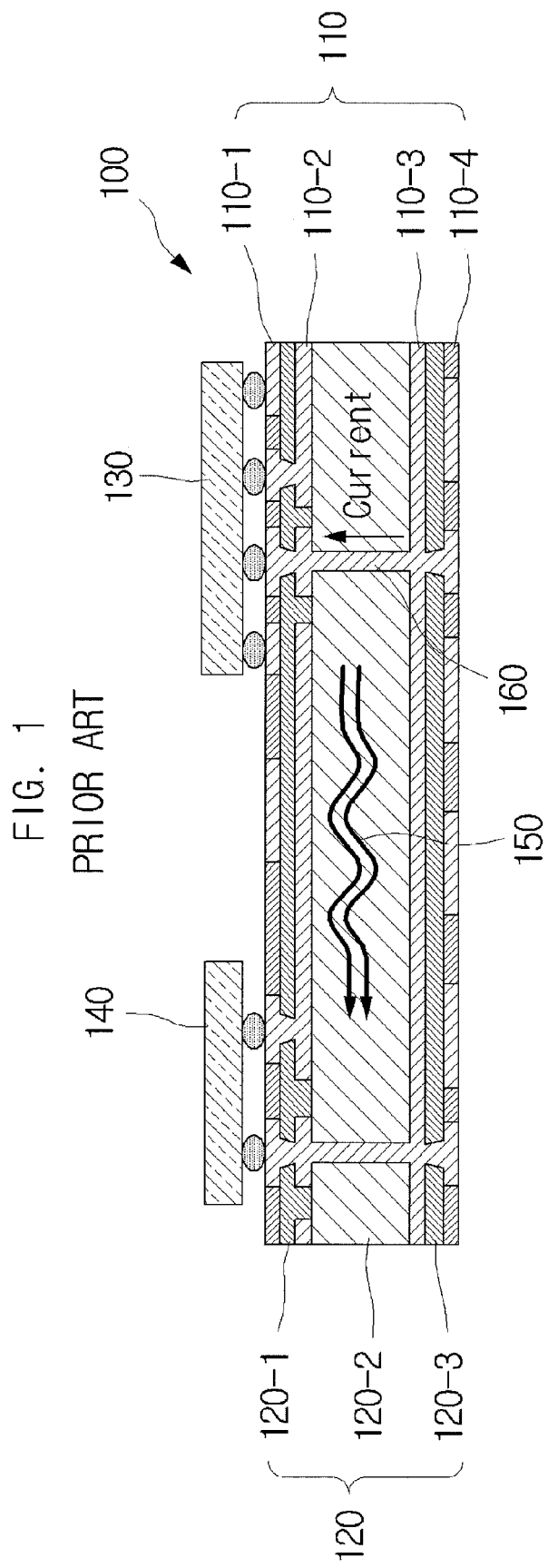
FIG. 1 is a sectional view showing a printed circuit board including an analog circuit and a digital circuit.
Figure 2:
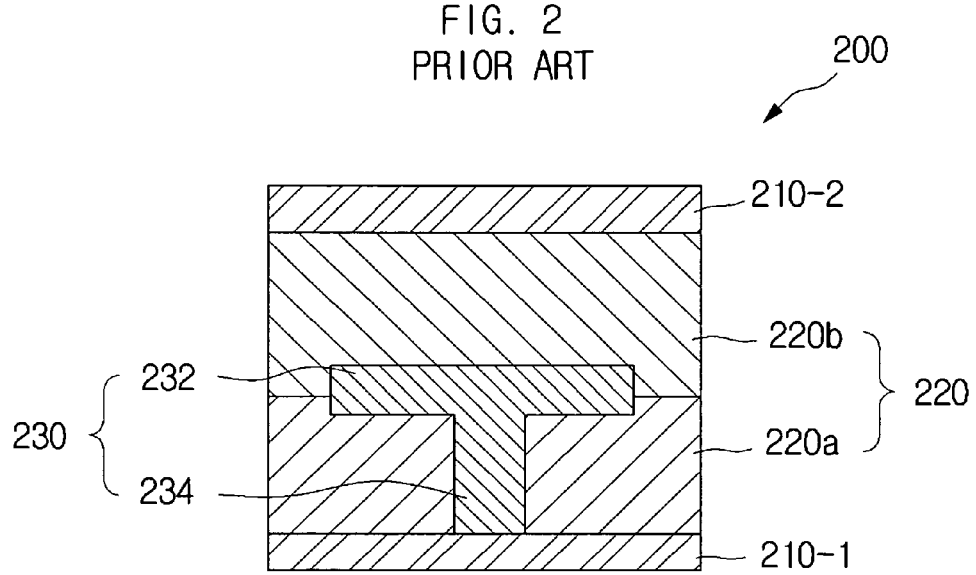
FIG. 2 is a sectional view showing an electromagnetic bandgap structure that, solves a problem mixed signals between an analog circuit and a digital circuit in accordance with a conventional art.
Figure 3:
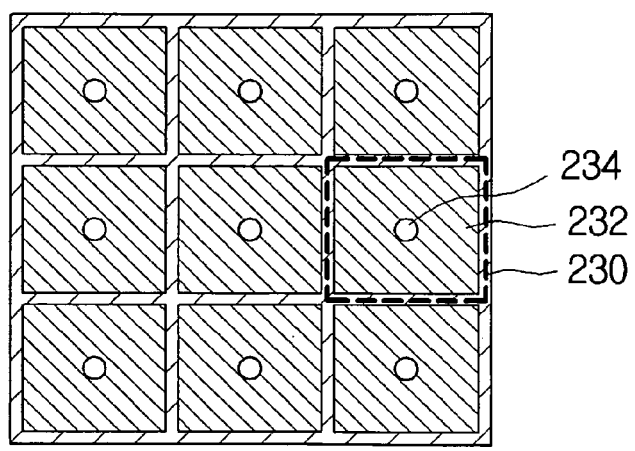
FIG. 3 is a plan view showing a metal plate configuration of the electromagnetic bandgap structure shown in FIG. 2.
Figure 4:
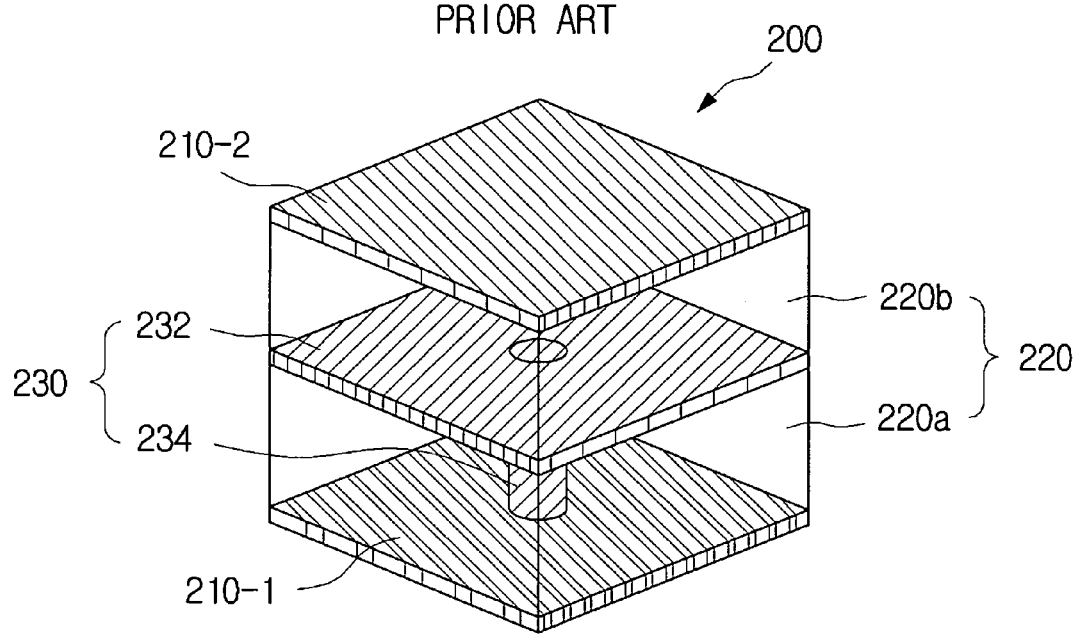
FIG. 4 is a perspective view showing the electromagnetic bandgap structure shown in FIG. 2.
Figure 5:
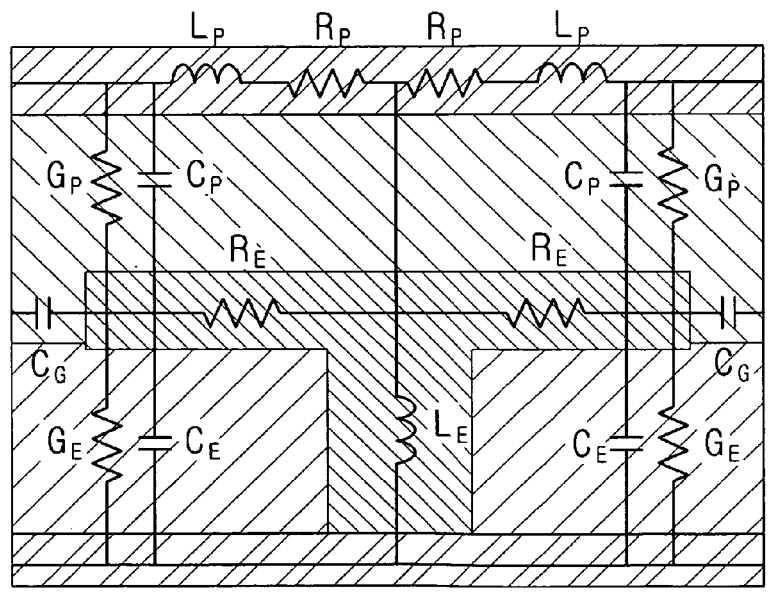
FIG. 5 is a schematic view showing, an equivalent circuit of the electromagnetic bandgap structure shown in FIG. 2.

In the printed circuit board, the electromagnetic bandgap structures 300, 400, 500 and 600 illustrated in FIG. 6 to FIG. 8 and FIG. 10 to FIG. 18b are disposed between the analog circuit and digital circuit. Correspondingly, the electromagnetic bandgap structures 300, 400, 500 and 600 are arranged between the RF circuit 140 and the digital circuit 130, shown in FIG. 1.

The electromagnetic bandgap structures 300, 400, 500 and 600 are arranged for an EM wave transferred to the RF circuit 130 to pass through the electromagnetic bandgap structures 300, 400, 500 and 600. In other words, the electromagnetic bandgap structures 300, 400, 500 and 600 can be arranged as a type of closed loop around the RF circuit 130 or around the digital circuit 140.

Alternatively, the electromagnetic bandgap structures 300, 400, 500 and 600 can be arranged anywhere from the digital circuit 140 to the RF circuit 130 in the printed circuit board.

By arranging the electromagnetic bandgap structures 300, 400, 500 and 600 inside, the printed circuit board in which the analog circuit and digital circuit are implemented concurrently can prevent the EM wave of certain frequency range (for example, 0.8~2.0 GHz) from being transferred.

Therefore, despite the small size, it is possible to solve aforementioned mixed signal problem by preventing the EM wave of certain frequency range from being transferred.

Hitherto, a variety of embodiments of the present invention that have three vias are described referring to FIG. 6 to FIG. 19.

However, the present invention is not restricted to what has been described so far, and in the electromagnetic band gap structure, on which a first metal layer, a first dielectric layer, a metal plate, a second dielectric layer and a second metal plate are stacked, any odd number of vias can be connected between the first metal layer and the metal plate through the metal line Here, the odd number of vias can be located on one planar surface (refer to embodiments illustrated in FIG. 6 and FIG. 10), or all of the vias except at least one can be located on one plane.

Although the metal line that connects the interval between the vias has a shape of straight line that is turned one or more times at right angle, as illustrated in FIG. 6 to FIG. 8 and FIG. 10 to FIG. 18, the metal line can be any curved line (for example, a spiral or a wave) that is not straight.

What is claimed is:

1. An electromagnetic bandgap structure comprising:
   a first metal layer;
   a first dielectric layer;
   a metal plate;
   a second dielectric layer;
   a second metal layer; and
   an odd number, at least 3, of vias serially connected with a metal line, the odd number of vias being disposed between the first metal layer and the metal plate,
   the first metal layer, the first dielectric layer, the metal plate, and the second dielectric layer being stacked, and
   the first metal layer and the metal plate being electrically connected to each other through the odd number of vias and the metal line.

2. The electromagnetic bandgap structure of claim 1, wherein the odd number of vias are located on one layer.

3. The electromagnetic bandgap structure of claim 1, wherein all of the odd number of vias except at least one are located on one layer.

4. The electromagnetic bandgap structure of claim 1, wherein the metal line is a shape of a straight line that connects each of the vias.

5. The electromagnetic bandgap structure of claim 1, wherein the metal line is a shape of a straight line or curve that is turned one or more times at angle and connects each of the vias.

6. The electromagnetic bandgap structure of claim 1, wherein there is a plurality of mushroom type structures between the first metal layer and the second metal layer, each of the plurality of mushroom type structures including an additional metal plate and an additional odd number, at least 3, of vias.

7. The electromagnetic bandgap structure of claim 6, wherein the additional metal plate of each of the additional plurality of mushroom type structures is placed on a same planar surface.

8. The electromagnetic bandgap structure of claim 1, wherein the metal line comprises a first metal line and a second metal line, and the odd number of vias comprises a first via, a second via and a third via, further comprising:
a first via land and a second via land, placed on a same planar surface as the metal plate and connected by the first metal line; and
a third via land and a fourth via land, placed on a same planar surface as the first metal layer and connected by the second metal line,
the first via having one end connected to the first metal layer and the other end connected to the first via land,
the second via having one end connected to the second via land and the other end connected to the third via land, and
the third via having one end connected to the fourth via land and the other end connected to the metal plate.

9. The electromagnetic bandgap structure of claim 8, wherein the metal plate houses the first via land, the second via land and the first metal line and has a hole such that the first via land, the second via land and the first metal line are not electrically connected.

10. The electromagnetic bandgap structure of claim 8, wherein the first metal layer houses the third via land, the fourth via land and the second metal line and has a hole such that the third via land, the fourth via land and the second metal line are not electrically connected.

11. The electromagnetic bandgap structure of claim 8, wherein the first via is located on one corner of the metal plate and the second via is symmetrically located on another corner of the metal plate.

12. The electromagnetic bandgap structure of claim 11, wherein the third via is located nearer to the first via than to the second via.

13. The electromagnetic bandgap structure of claim 12, wherein the first metal line is turned at angle toward one corner of the metal plate at which neither the first via nor the second via is located.

14. The electromagnetic bandgap structure of claim 13, wherein the second metal line is turned at angle toward the other corner that is not the corner at which neither the first via nor the second via is located and toward which the first metal line is turned at angle.

15. A printed circuit board comprising:
an analog circuit;
a digital circuit;
an electromagnetic bandgap structure disposed between the analog circuit and the digital circuit, the electromagnetic bandgap structure being stacked with a first metal layer, a first dielectric layer, a metal plate, a second dielectric layer and a second metal layer; and
an odd number, at least 3, of vias serially connected with a metal line, the odd number of vias being disposed between the first metal layer and the metal plate,
the first metal layer and the metal plate being electrically connected to each other through the odd number of vias and the metal line.

16. The printed circuit board of claim 15, wherein the first metal layer is one of a ground layer and a power layer, and the second metal layer is the other of the ground layer and the power layer.

17. The printed circuit board of claim 15, wherein the analog circuit is an RF circuit including an antenna receiving an external wireless signal.

18. The printed circuit board of claim 15, wherein the odd number of vias are located on one layer.

19. The printed circuit board of claim 15, wherein all of the odd number of vias except at least one are located on one layer.

20. The printed circuit board of claim 15, wherein the metal line is a shape of a straight line that connects between each of the vias.

21. The printed circuit board of claim 15, wherein the metal line is a shape of a straight line or curve that is turned one or more times at angle and connects between each of the vias.

22. The printed circuit board of claim 15, wherein there is a plurality of mushroom type structures between the first metal layer and the second metal layer, each of the plurality of mushroom type structures including the an additional metal plate and an additional odd number, at least 3, of vias.

23. The printed circuit board of claim 22, wherein the metal plate of each of the plurality of mushroom type structures is placed on a same planar surface.

24. The printed circuit board of claim 15, wherein the metal line comprises a first metal line and a second metal line, the odd number of vias comprises a first via, a second via and a third via, and further comprising:
a first via land and a second via land, placed on a same planar surface with the metal plate and connected by the first metal line; and
a third via land and a fourth via land, placed on a same planar surface with the first metal layer and connected by the second metal line,
the first via having one end connected to the first metal layer and the other end connected to the first via land,
the second via having one end connected to the second via land and the other end connected to the third via land, and
the third via having one end connected to the fourth via land and the other end connected to the metal plate.

25. The printed circuit board of claim 24, wherein the metal plate houses the first via land, the second via land and the first metal line and has a hole such that the first via land, the second via land and the first metal line are not electrically connected.

26. The printed circuit board of claim 24, wherein the first metal layer houses the third via land, the fourth via land and the second metal line and has a hole such that the third via land, the fourth via land and the second metal line are not electrically connected.

27. The printed circuit board of claim 24, wherein the first via is located on one corner of the metal plate and the second via is symmetrically located on another corner of the metal plate.

28. The printed circuit board of claim 27, wherein the third via is located nearer to the first via than to the second via.

29. The printed circuit board of claim 28, wherein the first metal line is turned at angle toward an additional corner of the metal plate at which neither the first via nor the second via is located.

30. The printed circuit board of claim 29, wherein the second metal line is turned at angle toward the additional corner that is not the corner at which neither the first via nor the second via is located and toward which the first metal line is curved.

* * * * *

UNITED STATES PATENT AND TRADEMARK OFFICE
CERTIFICATE OF CORRECTION

| | | |
|---|---|---|
| PATENT NO. | : 8,368,488 B2 | Page 1 of 1 |
| APPLICATION NO. | : 12/155941 | |
| DATED | : February 5, 2013 | |
| INVENTOR(S) | : Han Kim et al. | |

It is certified that error appears in the above-identified patent and that said Letters Patent is hereby corrected as shown below:

In the Claims:

Column 14, Line 18, In Claim 22, delete "the an" and insert -- an --, therefor.

Signed and Sealed this
Twenty-eighth Day of May, 2013

Teresa Stanek Rea
*Acting Director of the United States Patent and Trademark Office*